United States Patent [19]

Bose et al.

[11] 4,430,582

[45] Feb. 7, 1984

[54] FAST CMOS BUFFER FOR TTL INPUT LEVELS

[75] Inventors: Bidyut K. Bose, Fremont; John M. Jorgensen, San Jose, both of Calif.

[73] Assignee: National Semiconductor Corporation, Santa Clara, Calif.

[21] Appl. No.: 321,839

[22] Filed: Nov. 16, 1981

[51] Int. Cl.³ .................. H03K 17/30; H03K 17/14
[52] U.S. Cl. .................. 307/297; 307/491; 307/475; 330/300
[58] Field of Search .............. 307/296 R, 297, 491, 307/475; 323/313–314; 330/289, 299, 300

[56] References Cited

U.S. PATENT DOCUMENTS

| | | | |
|---|---|---|---|
| 3,657,575 | 4/1972 | Taniguchi et al. | 307/297 X |
| 4,004,164 | 1/1977 | Cranford, Jr. et al. | 307/297 |
| 4,127,783 | 11/1978 | Alaspa | 307/297 |
| 4,135,125 | 1/1979 | Oura | 330/277 X |
| 4,163,161 | 7/1979 | Walker | 307/296 R X |
| 4,260,946 | 4/1981 | Wheatley, Jr. | 307/297 |
| 4,300,061 | 11/1981 | Mihalich et al. | 307/297 |

Primary Examiner—Stanley D. Miller
Assistant Examiner—David R. Hudspeth
Attorney, Agent, or Firm—Gail W. Woodward; Paul J. Winters; Michael J. Pollock

[57] ABSTRACT

A CMOS integrated circuit is made compatible with TTL input signals. A regulator operates the CMOS gates in an array at a voltage that is slightly lower than the supply. The regulator sense circuit is made responsive to an operating gate and to a TTL bias reference. Accordingly, the regulator will compensate for changes in ambient conditions and manufacturing variations so that the gate array devices will reliably respond to TTL level switching signals.

9 Claims, 8 Drawing Figures

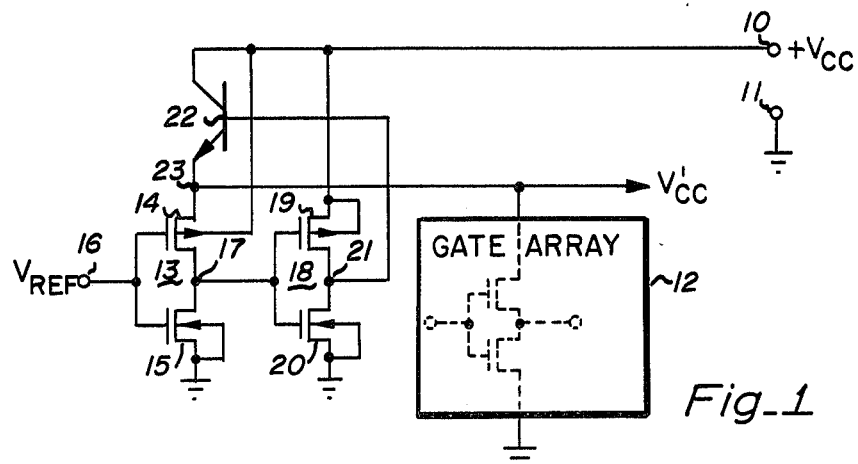
Fig_1
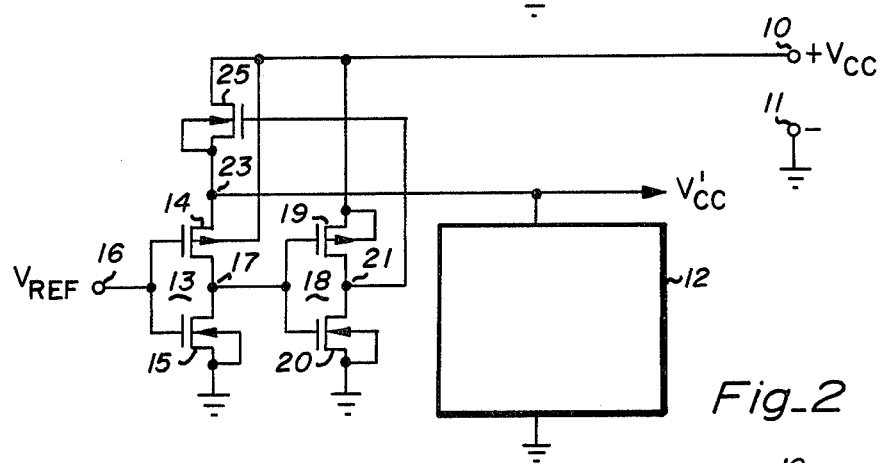
Fig_2
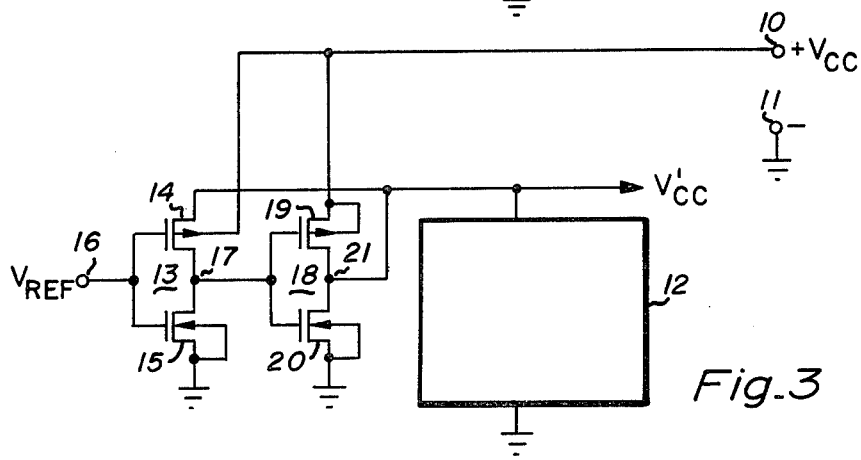
Fig_3
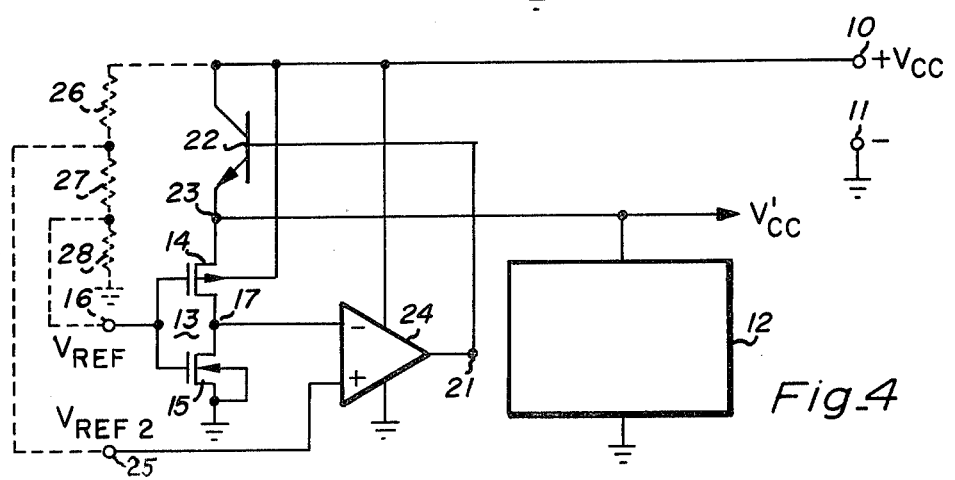
Fig_4

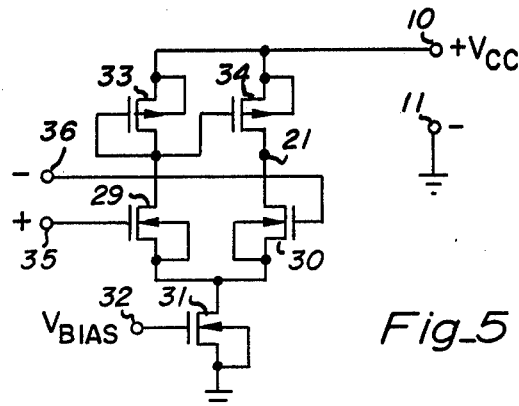
Fig_5
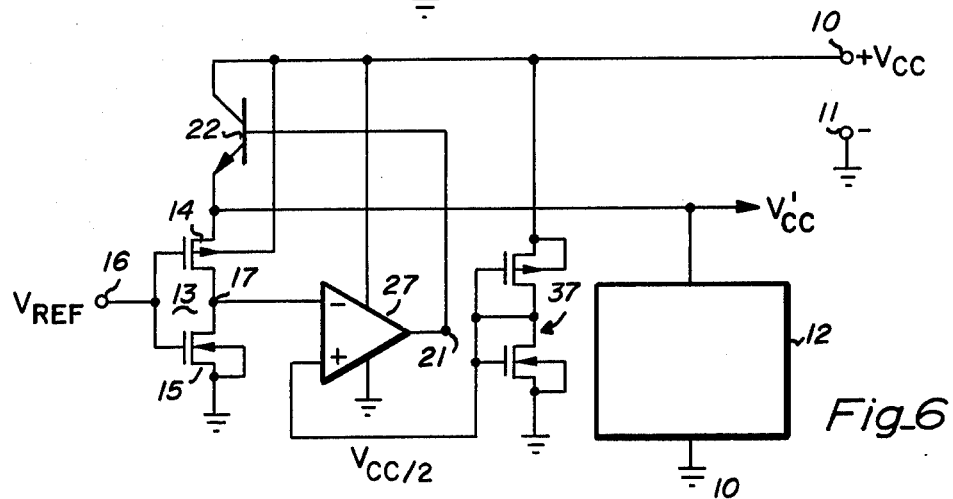
Fig_6
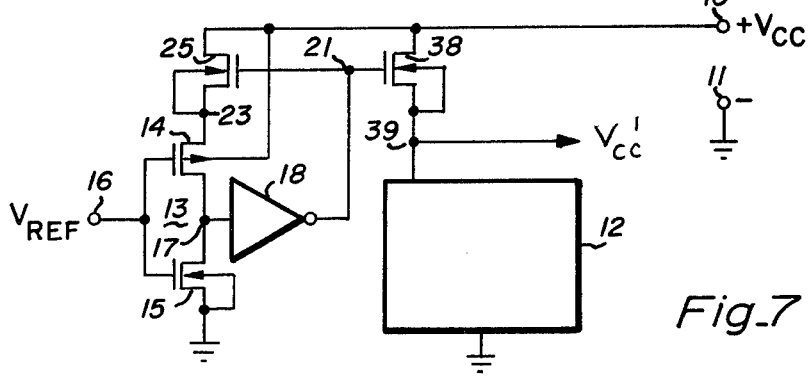
Fig_7
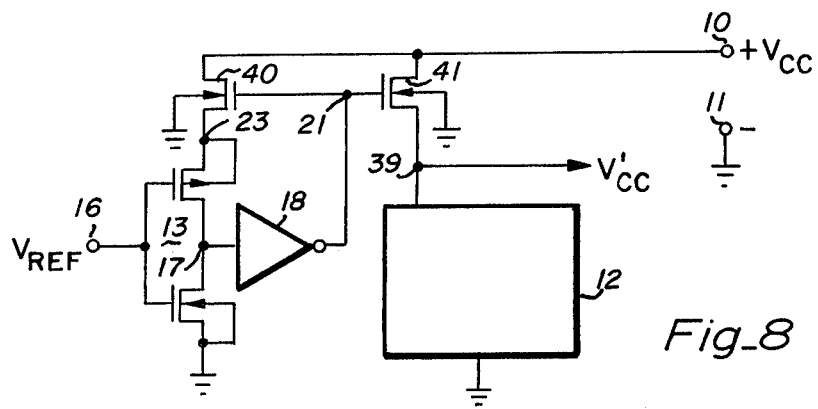
Fig_8

FAST CMOS BUFFER FOR TTL INPUT LEVELS

BACKGROUND OF THE INVENTION

The invention is related to the complementary metal oxide semiconductor (CMOS) structures, particularly those involving a large number of gates fabricated into a single integrated circuit chip. Such arrays of gates are useful in fabricating logic circuits in which gates are interconnected to achieve a desired logic function. One of the problems that beset such arrays is the variability of the performance of the gates as a function of variations in ambient conditions and in the manufacturing process.

SUMMARY OF THE INVENTION

It is an object of the invention to build a control circuit into a CMOS integrated circuit in which the gates are caused to respond to TTL signals.

It is a further object of the invention to vary the supply voltage in a CMOS integrated circuit wherein the gates all respond to TTL logic levels, regardless of ambient conditions or manufacturing variations.

It is a still further object of the invention to employ a voltage regulator in the supply line in a CMOS integrated circuit with the regulator being made responsive to a representative gate biased for TTL logic level operation.

These and other objects are achieved as follows. A representative gate in an array is supplied with a reference input voltage that is selected for TTL compatibility. The gate output should be operated at one half of the supply voltage for this reference input. A series pass element is coupled between the integrated circuit supply line and the power supply input and its conductivity is related to the representative gate output. When the representative gate output exceeds $V_{cc}/2$, the pass device is rendered less conductive, thereby lowering the array supply voltage. When the output is less than $V_{cc}/2$, the pass is rendered more conductive, thereby raising the array supply voltage. This negative feedback arrangement establishes the representative gate output of $V_{cc}/2$, even in the face of substantial changes in ambient and manufacturing processes.

We have discovered that the above described regulation is effective in compensating such arrays for the ordinarily encountered CMOS manufacturing variations and for at least ±10% variation in array supply voltage. While the emphasis is upon gate arrays, the invention is equally applicable to any CMOS integrated circuit system that interfaces with TTL compatible systems, and accepts inputs from such TTL systems.

BRIEF DESCRIPTION OF THE DRAWINGS

FIG. 1 is a schematic diagram showing the basic elements of the invention.

FIG. 2 is a schematic diagram of an alternative embodiment of the invention, using only MOS active devices.

FIG. 3 is a schematic diagram of another alternative embodiment of the invention.

FIG. 4 is a schematic diagram of still another alternative embodiment of the invention.

FIG. 5 is a schematic diagram of the typical circuit employed in amplifier 24 of FIG. 4.

FIG. 6 is a schematic diagram of a circuit which establishes a $V_{cc}/2$ reference voltage.

FIG. 7 is a schematic diagram of still another all-MOS alternative embodiment of the invention wherein P-well CMOS construction is employed.

FIG. 8 is a schematic diagram of the N-well CMOS implementation of the FIG. 7 embodiment of the invention.

DESCRIPTION OF THE INVENTION

FIG. 1 shows the basic circuit of the invention. A common power supply $V_{cc}$ is coupled between positive terminal 10 and ground 11. A reduced level $V_{cc}'$ is supplied to array 12 which is representative of a large number of gates, as would be found in a gate array. One such gate is shown in dashed outline. It is to be understood that while applied to gate arrays in the preferred embodiment, the invention is useful in the construction of any CMOS integrated circuit requiring TTL input compatibility.

Gate 13 is typical of the gates in the array and is composed of P-channel transistor 14 and N channel transistor 15 coupled together to act as a CMOS inverter gate. Node 17 will maintain an inverted logic state with respect to the logic at terminal 16. However, the reference or switching level can be different. Typically, the CMOS reference level is $V_{cc}/2$. A logic one is close to $+V_{cc}$ and a logic zero is close to ground. In TTL, which is typically specified to operate at a 5-volt supply, the input logic is typically over 2 volts for a logic one and less than 0.8 volt for a logic zero. The switching reference which is midway between these values is 1.4 volts. In the circuit of FIG. 1, if a d-c reference voltage $V_{REF}$ is coupled to terminal 16, the conduction of devices 14 and 15 can be adjusted to develop $V_{cc}/2$ at node 17 to set the circuit performance level. For example, when TTL compatibility is desired, a $V_{REF}$ of 1.4 volts is used and the inverter formed by devices 19 and 20 is in a region of high gain.

Inverter gate 18 is designed to provide a level shift so that with a 2.5 volt input its output at node 21 is slightly under $V_{cc}$. This can be done by making P-channel transistor 19 substantially more conductive than N channel transistor 20.

Bipolar NPN transistor 22 is constructed using CMOS components well known in the art to act as a variable pass device. Its conduction will pass current from $V_{cc}$ at terminal 10 to $V_{cc}'$ at node 23. Basically whatever the voltage is at node 21, $V_{cc}'$ will be one $V_{BE}$ below it. Transistor 22 acts as an emitter follower with a diode drop voltage shift. Thus with TTL logic and $V_{cc}$ at 5 volts, node 21 could operate at about 4.9 volts with $V_{cc}'$ at about 4.2 volts. Ordinarily, $V_{cc}'$ is kept as high as practicable to maximize the speed of the gates in the array.

It can be seen that node 23 is regulated because it is included in a high gain negative feedback loop. Inverter 18 provides the inversion and it has high gain. Transistor 22, acting as an emitter follower, has current gain and is noninverting. The circuit will act to set the level of voltage of node 23 so that node 17 is at the gate trip point which ordinarily is $V_{cc}/2$ or about 2.5 volts for a TTL supply level.

Since $V_{cc}'$ is obtained using the $V_{BE}$ of transistor 22, the regulator output will display approximately a 2 millivolt per degree centigrade temperature coefficient. Thus, the circuit of FIG. 1 will automatically adjust $V_{cc}'$ to compensate for variations in ambient operating conditions. The circuit will also compensate for changes in processing of the CMOS devices that would ordinarily shift the gate's trip point. As a result, the gates in the CMOS array can be made compatible with TTL. If desired, some other selected logic configuration could be employed and a suitable $V_{REF}$ level established.

FIG. 2 illustrates an alternative circuit embodiment. Bipolar transistor 22 of FIG. 1 has been replaced by N-channel transistor 25 which is connected as a source follower. It is only necessary to make transistor 25 large enough to pass the current required by $V_{cc}'$ to supply all of the input gates in the array.

FIG. 3 shows a second alternative embodiment in which the output of inverter 18 provides the $V_{cc}'$ supply. The emitter follower of FIG. 1 and the source follower of FIG. 2 have been omitted. What was node 21 of FIGS. 1 and 2 is now directly coupled to $V_{cc}'$. Since P-channel transistor 19 is required to supply the gate array current, it is made sufficiently large to satisfy the total current requirement. In this configuration it may be possible to omit transistor 20.

FIG. 4 shows a more sophisticated alternative circuit embodiment. Here, a differential operational amplifier (op amp) 24 is employed. A second or $V_{REF2}$ at terminal 25 is applied to the noninverting input. The output, node 21, which is typically selected to be close to one P-channel threshold below $V_{cc}$, is directly coupled to the base of transistor 22. In the TTL compatible configuration, the $V_{cc}$ supply can be divided by resistors 26–28 which are shown joined by dashed lines due to their optional nature. If these resistors are made to have values of 25K, 11K, and 14K ohms, respectively, $V_{REF}$ would be 1.4 volts and $V_{REF2}$ would be 2.5 volts. These resistors will dissipate about 500 microwatts and draw a current of about 100 microamperes. This circuit will adjust the voltage at $V_{cc}'$ (node 23) to equalize the inverting and noninverting inputs at op amp 24. Since op amp 24 can be made to have very high gain, such circuits can be quite stable.

FIG. 5 shows a CMOS circuit suitable for use as op amp 24 of FIG. 4. Matched N-channel transistors 29 and 30 are connected as a differential pair with their tail current being supplied by N-channel transistor 31. A bias voltage coupled to terminal 32 turns transistor 31 on to pass the desired tail current. Transistors 33 and 34 are P-channel load devices connected in a current mirror configuration that provides a single ended output at node 21. For this circuit input terminal 35 constitutes the noninverting input, while terminal 36 constitutes the inverting input.

FIG. 6 constitutes still another alternative embodiment of the invention. The configuration is similar to that of FIG. 4, but the noninverting input for op amp 24 is obtained from an inverter gate 37. This inverter gate has its output strapped to its input so that it will operate at its trip point which is very close to $V_{cc}/2$. This means that as long as $V_{REF}$ at terminal 16 is 1.4 volts the circuit will be TTL compatible; otherwise, the circuit functions in much the same manner as that of FIG. 4.

FIG. 7 illustrates yet another alternative embodiment of the invention, using an arrangement similar to that of FIG. 2. The CMOS parts are of P-well construction and N-channel transistor 25 acts as a source follower to regulate the potential at node 23. Transistor 38 acts as a current mirror to node 39 which is the source of $V_{cc}'$. If transistors 25 and 39 are matched, nodes 23 and 39 will be at the same potential. This configuration is particularly useful where a large number of gates in 12 are to be controlled. In effect, transistor 38 acts as a fan-out control.

FIG. 8 is the conventional N-well CMOS construction version of FIG. 7. In this implementation the back gates of N-channel transistors 40 and 41 are returned to ground, which is the IC substrate terminal.

The invention has been described and several alternative embodiments detailed. Clearly, there are other alternatives and equivalents within the spirit and intent of the invention that will occur to a person skilled in the art upon reading the foregoing description. For example, while FIGS. 4 and 6 show the use of a bipolar pass transistor it is clear that it could be an N-channel transistor as was shown in FIG. 2, or a P-channel transistor as shown in FIG. 3. Accordingly, it is intended that the scope of the invention be limited only by the following claims.

We claim:

1. In a CMOS integrated circuit in which at least one gate is designed to switch at a predetermined output reference level and operate with a plurality of other gates from a common power supply, the improvement comprising operating said gates from a regulated supply potential that is derived from said common power supply and is varied to compensate for changes in operating temperature and fabrication parameters, said regulated potential being determined by a representative operating gate that has its input terminal coupled to a TTL compatible reference potential.

2. The improvement of claim 1 wherein said regulated supply potential is obtained from a regulator circuit comprising:
   a variable conductance pass element coupled between said common power supply and said gates whereby the switching level of said gates can be altered; and
   means for varying the conductance of said pass element in response to changes in the difference between the output potential of said representative operating gate and said reference level potential.

3. The improvement of claim 2 wherein said means for varying includes a second operating gate coupled in cascade with said representative operating gate and having substantial amplification.

4. The improvement of claim 3 wherein said second operating gate has its active devices ratioed to produce a substantial level shift thereby to produce a nominal output high close to the Vcc level of said common power supply.

5. The improvement of claim 2 wherein said means for varying comprise a differential operational amplifier having an output coupled to said variable conductance pass element, an inverting input coupled to the output of said representative operating gate and a noninverting input coupled to a potential representing the desired operating level of the output of said representative operating gate.

6. The improvement of claim 5 wherein said variable conductance pass element is an NPN bipolar transistor.

7. The improvement of claim 5 wherein said variable conductance pass element is an N-channel field effect transistor.

8. The improvement of claim 5 wherein said variable conductance pass element is a P-channel field effect transistor.

9. The improvement of claim 1 wherein said structure includes a gate array in which a plurality of indentical gates is fabricated and the switching threshold of said plurality is slaved to that of said representative operating gate.

* * * * *